(12) United States Patent
Motz

(10) Patent No.: US 7,298,185 B2
(45) Date of Patent: Nov. 20, 2007

(54) CIRCUIT ARRANGEMENT FOR PRODUCTION OF A RESET SIGNAL AFTER A SUPPLY HAS FALLEN AND RISEN AGAIN

(75) Inventor: Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 179 days.

(21) Appl. No.: 11/054,356

(22) Filed: Feb. 9, 2005

(65) Prior Publication Data

US 2005/0195001 A1 Sep. 8, 2005

(30) Foreign Application Priority Data

Feb. 9, 2004 (DE) ...................... 10 2004 006 254

(51) Int. Cl.
 *H03L 7/00* (2006.01)
(52) U.S. Cl. .................................... 327/143
(58) Field of Classification Search ............... 327/143, 327/198
See application file for complete search history.

(56) References Cited

U.S. PATENT DOCUMENTS

| | | | |
|---|---|---|---|
| 4,594,688 A | 6/1986 | Uno | 365/95 |
| 4,634,904 A * | 1/1987 | Wong | 327/143 |
| 5,321,317 A | 6/1994 | Pascucci et al. | 327/143 |
| 5,517,144 A | 5/1996 | Nakashima | 327/198 |
| 5,552,725 A | 9/1996 | Ray et al. | 327/143 |
| 5,812,001 A | 9/1998 | Imamiya | 327/198 |
| 5,847,586 A | 12/1998 | Burstein et al. | 327/142 |
| 6,016,068 A * | 1/2000 | Ding | 327/142 |
| 6,060,919 A * | 5/2000 | Wilson et al. | 327/143 |
| 6,556,058 B2 | 4/2003 | Ohbayashi et al. | 327/143 |
| 6,600,350 B2 | 7/2003 | Sekimoto et al. | 327/143 |
| 2001/0028263 A1* | 10/2001 | Ohbayashi et al. | 327/143 |
| 2003/0201807 A1 | 10/2003 | Ohbayashi et al. | 327/143 |

FOREIGN PATENT DOCUMENTS

| | | |
|---|---|---|
| EP | 0 482 661 A2 | 4/1992 |
| JP | 55047727 A | 4/1980 |
| JP | 01192212 A * | 8/1989 |
| JP | 01212024 A | 8/1989 |

* cited by examiner

*Primary Examiner*—Quan Tra
(74) *Attorney, Agent, or Firm*—Maginot, Moore & Beck

(57) ABSTRACT

The invention relates to a circuit arrangement for production of a reset signal after a supply voltage (Vdd) has fallen and risen again, which circuit arrangement has two cross-coupled inverters (INV1, INV2) and an initialization circuit (S) which is connected to the input of one of the inverters (INV2), in which case the outputs of the inverters (INV1, INV2) are capacitively connected asymmetrically, andlor in which case the inverters (INV1, INV2) have different transfer voltages.

16 Claims, 8 Drawing Sheets

CIRCUIT ARRANGEMENT FOR PRODUCTION OF A RESET SIGNAL AFTER A SUPPLY HAS FALLEN AND RISEN AGAIN

BACKGROUND

The present invention relates to a circuit arrangement for production of a rest signal after a supply voltage has fallen and risen again, in particular for use in a circuit which has a static memory.

Static memories (SRAMs) permanently require a supply voltage for reliable maintenance of a predetermined memory state, and this supply voltage must not fall below a predetermined value which is dependent on the technology of the respective memory. If the supply voltage falls below this minimum value despite this, then this can lead to undesirable changes in the memory states of individual memory cells, or to undefined memory states.

It is therefore necessary to identify such a fall in the supply voltage (which, for example, may be also be caused by EMC interference radiation) and to make a reset signal available once the supply voltage has risen again to a value which is required for reliable operation. A reset signal such as this may be used, for example, to carry out initialization of the memory via further circuit components. Various concepts are known for production of such reset signals.

Fundamentally, it is possible to compare the supply voltage with a reference voltage continuously and to produce a reset signal when the supply voltage falls below the reference voltage. A circuit arrangement such as this, which uses a reference voltage source, for producing a reset signal is described, for example, in U.S. Pat. No. 5,552,725.

This concept has the disadvantage that the reference voltage source which, for example, may also be in the form of a band gap reference voltage source, permanently draws an operating current in the μA range. This concept is not suitable for battery-powered circuit applications in which a minimum power consumption must be ensured in order to achieve a long battery life.

One example of applications such as these is so-called ultra low power sensors, whose voltage supply is intended to be ensured, by means of a small battery, for a time period of three to ten years. Sensors such as these operate intermittently with short operating phases during which the mean current that is drawn is in the μA range, and with rest phases which are long in comparison to the operating phases and in which the current that is drawn is intended to be less than 20 nA, in order to ensure a long battery life. Reset circuits which draw small currents such as these can be produced, for example, using very high-value resistors, but these occupy a very large amount of space. In the case of sensors such as these, comparison values relating to the measured values determined by the sensor are stored, for example, in an SRAM. Sensors such as these are used, for example, as tire pressure sensors in motor vehicles, which cannot be connected to the vehicle power supply system voltage and which must therefore be supplied via their own battery, which is isolated from the vehicle power supply system battery.

U.S. Pat. No. 6,556,058 B2 describes a POR circuit (POR=Power On Reset) for production of a reset signal after a supply voltage has been switched on, in which a threshold voltage of an MOS transistor is used as a reference voltage for the production of a reset signal when the supply voltage rises.

U.S. Pat. No. 6,600,350 B2 describes a POR circuit having a capacitor which is connected to the supply voltage via a resistor, and whose state of charge is evaluated in order to produce a reset signal. This circuit has the disadvantage that it does not operate reliably when the supply voltage rises slowly again.

The aim of the present invention is to provide a circuit arrangement for production of a reset signal after a supply voltage has fallen and risen again, which circuit arrangement draws a very low current, can be produced easily and operates reliably.

SUMMARY

The circuit arrangement according to the invention for production of a reset signal after a supply voltage has fallen and risen again has a first and a second inverter, which each have one input and one output. The input of the first inverter is in this case coupled to the output of the second inverter, and the input of the second inverter is coupled to the output of the first inverter. The two inverters are connected between the first and the second supply voltage terminals, between which the supply voltage is present. The two cross-coupled inverters operate like a static memory cell, which can be initialized via an initialization circuit which is connected to the input of one of the inverters.

The circuit arrangement also has a first rectifier element which is connected between the output of one of the inverters and one of the supply voltage terminals, and a first capacitance which is connected between this output and the other of the supply voltage terminals and which is larger than a capacitance which is provided between the output of the other inverter and the respective supply voltage terminal. In the case of the circuit arrangement according to the invention, the larger capacitance on the output of one of the inverters means that the static memory cell formed by the first and second inverters is capacitively asymmetric. This first capacitance is discharged via the rectifier element when the supply voltage falls, in order to follow the falling supply voltage. When the supply voltage rises again, the first capacitance ensures that the output of the inverter follows the voltage rise of the supply voltage in a slowed-down form, in order to ensure that, when the supply voltage rises again, the memory cell assumes a memory state which is complementary to the memory state after initialization of the memory cell, that is to say before the supply voltage fell. In the case of this circuit arrangement, the output signal from either of the two inverters is evaluated as a reset signal, with a high level or a low level of this output signal being used as the reset level depending on the level that this signal assumes after initialization of the circuit arrangement.

The first and second inverters may each have a first transistor and a second transistor, which is complementary to this first transistor, in which case the load paths of those first and second transistors of the inverters are connected between the first and the second supply voltage terminal, and in which case the drive connections of the first and second transistors of an inverter are jointly connected to the input of the respective inverter.

The first and second transistors in the inverters may in this case be in the form of mutually complementary MOS transistors. MOS transistors such as these inherently all have a drive capacitance, the so-called gate/source capacitance, between their gate connection, which forms the drive connection, and their source connection, which forms one of the load path connections. If the inverters are produced in a manner such as this by means of MOS transistors, it is possible for the first capacitance which is connected to the output of one of the inverters, and thus to the input of the other inverter, to be provided by the gate/source capacitance of one of the transistors, and this gate/source capacitance can be varied by means of the surface area of the gate electrode of this transistor.

It is, of course, also possible for the first capacitance to be formed by a separate capacitor, which is connected between the output of one of the inverters and one of the supply voltage terminals.

The switching behavior of the circuit arrangement according to the invention after the supply voltage has fallen and risen again, from a first switching state after initialization of the circuit arrangement to a second, complementary switching state after the voltage supply has risen again can be improved by the first and second inverters having different transfer voltages. The transfer voltage of an inverter is in this case the value of an input voltage which is applied to the input for which an output voltage which is produced at the output reaches 50% of its level change resulting from the supply voltage.

The transfer voltages of the inverters may in this case be varied by means of the width-to-length ratio of the first and second transistors in the inverters. It is also possible to vary the transfer voltages of the inverters by means of a diode, which is connected in series with the load paths of the first and second transistors in the inverters. Using modern technologies, this diode can advantageously be in the form of an MOS transistor with a low threshold voltage (low threshold voltage transistor), whose drain and gate are shorted together. This allows diode voltages of only about 0.4 V to be achieved. The provision of diodes such as these makes it possible for the inverter transistors to be discharged to below the threshold voltage when operating voltage dips occur.

The circuit arrangement as claimed in claim 11 likewise has a first and a second inverter, which each have one input and one output and which are likewise cross-coupled, with the output of the first inverter being connected to the input of the second inverter, and the output of the second inverter being connected to the input of the first inverter. The two inverters each have two supply connections, which are connected between a first and a second supply voltage terminal, between which the supply voltage is present. These two inverters form a memory cell which can be initialized via an initialization circuit which is connected to the input of one of the inverters. The two inverters also have different transfer voltages, which are matched to one another such that, after the supply voltage has fallen and risen again, the two inverters each assume complementary switching states in comparison to the respective switching states after initialization of the circuit arrangement.

This circuit arrangement, in which the memory state is changed by the provision of different transfer voltages for the two inverters, is particularly suitable for detection of a slow rise in the supply voltage after it has fallen.

The two inverters preferably each have a first and a second transistor, whose load paths are connected in series between the supply connections of the inverters, and whose drive connections are each jointly connected to the input of the respective inverter.

The transfer voltages of the inverters can be varied by means of the width-to-length ratio of the first and second transistors, or by the provision of a resistance element or a diode in series with the load paths of the first and second transistor.

The circuit arrangement according to the invention, which can be produced in particular using transistors based on CMOS technology, draws no significant current after it has been initialized and can therefore be used in particular for detection of a supply voltage falling and rising again in circuit arrangements in which the reset circuit has to have a low power consumption.

BRIEF DESCRIPTION OF THE DRAWINGS

The present invention will be explained in more detail in the following text using exemplary embodiments and with reference to the Figures, in which.

Unless stated to the contrary, identical-reference symbols in the Figures denote identical circuit components and signals with the same meaning.

DESCRIPTION

Figure 1:
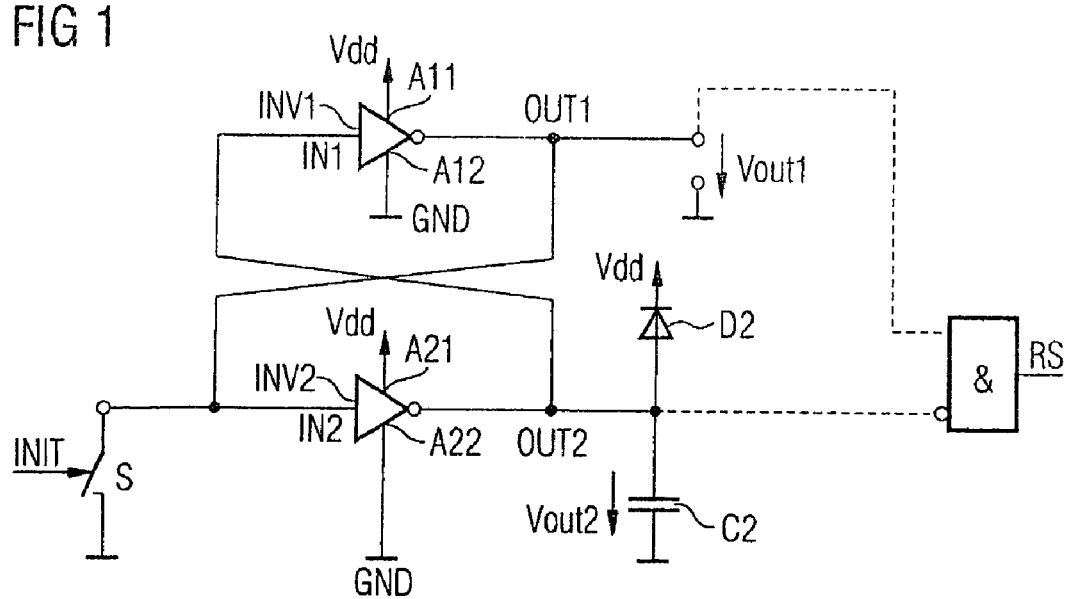
FIG. 1 shows a first exemplary embodiment of a circuit arrangement according to the invention having two cross-coupled inverters, whose outputs are capacitively connected asymmetrically.

FIG. 1 shows a first exemplary embodiment of a circuit arrangement for production of a reset signal after a supply voltage Vdd has fallen and risen again. The circuit arrangement has a first inverter INV1 having an input IN1 and an output OUT1, as well as a second inverter INV2 having an input IN2 and an output OUT2. The two inverters also each have first and second supply connections A11, A12, A21, A22, which are each connected between supply voltage terminals between which the supply voltage Vdd is present. This supply voltage Vdd in the exemplary embodiment is related to a reference ground potential GND to which the two inverters INV1, INV2 are respectively connected via their second connecting terminal A12, A22.

The two inverters INV1, INV2 are cross-coupled by the output OUT1 of the first inverter INV1 being connected to the input IN2 of the second inverter INV2, and by the output OUT2 of the second inverter INV2 being connected to the input IN1 of the first inverter INV1.

The first and second inverters INV1, INV2 operate in the form of a memory cell which can be initialized by means of an initialization circuit. In the exemplary embodiment, the initialization circuit has a switch S which is connected between the input IN2 of the second inverter INV2 and the reference ground potential GND, and which can be driven by means of an initialization signal INIT. The two inverters INV1, INV2 are connected capacitively asymmetrically by connecting a first capacitance C2 between the output OUT2 of the second inverter INV2 and the terminal for the reference ground potential GND, while no such additional capacitance is provided between the output OUT1 of the first inverter INV1 and the terminal for the reference ground potential GND. The capacitance between the output terminal OUT2 of the second inverter INV2 and the terminal for the reference ground potential GND is greater than the capacitance between the first output terminal OUT1 of the first inverter INV1 and the terminal for the reference ground potential GND, on the assumption that the two inverters are internally designed to be identical.

The method of operation of the circuit arrangement illustrated in FIG. 1 which, because of its similarity to a memory cell, is referred to in the following text as a reset cell, will be explained in the following text with reference to FIG. 2.

Figure 2:
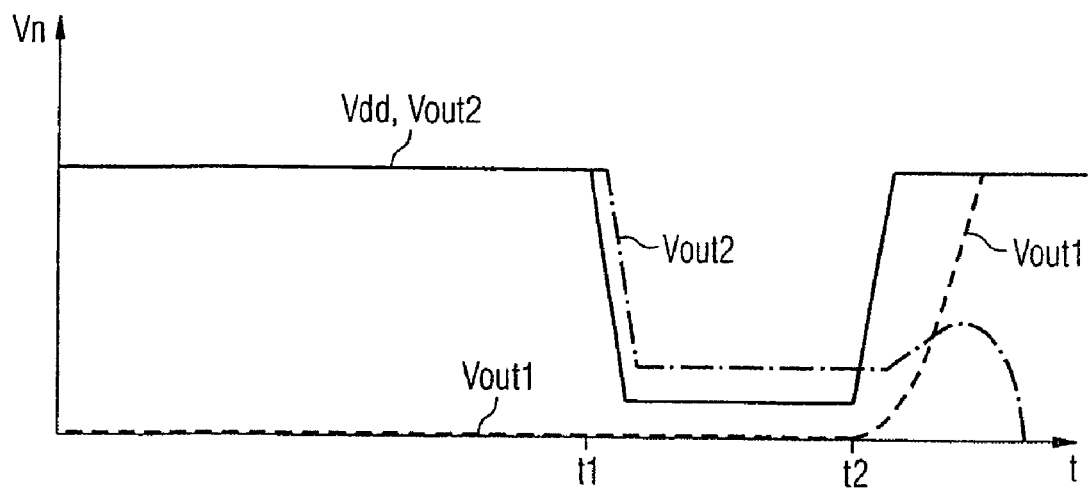
FIG. 2 shows, by way of example, time profiles of signals in the circuit illustrated in FIG. 1, in order to explain the method of operation when the supply voltage falls.

FIG. 2 shows, by way of example, the time profile of the supply voltage Vdd which, in the example, falls to a considerably low voltage level from a time t1 starting from a first voltage level Vn which, for example, corresponds to the nominal voltage level for the supply voltage Vdd and which rises to the nominal voltage level Vn again from a time t2, starting from this low voltage level. Fluctuations in the supply voltage Vdd such as these may be caused, for example, by external influences, for example by radiated EMC interference.

The rest of the explanation is based on the assumption that the reset cell has been initialized before the time t1. For initialization of the reset cell, the input IN2 of the second inverter INV2 and the output OUT1 of the first inverter INV1 are connected to the reference ground potential GND via the switch S, so that the output signal Vout1 which is produced at the output OUT1 of the first inverter INV1 assumes a low level. This low level is also stored after the switch S has been opened, since the low level at the input of the second inverter INV2 causes a high level at its output OUT2, and thus at the input IN1 of the first inverter INV1. During the initialization process, the switch S remains closed until the low level at the input IN2 of the second inverter INV2 results in the first capacitance C1 at its output OUT2 rising to the value of the supply voltage Vdd. The illustration in FIG. 2 is in this case based on the assumption that the inverters INV1, INV2 are ideal inverters, which produce at the output the level of the supply potential Vdd as a high level and the level of the reference ground potential GND as a low level.

If the supply voltage Vdd falls starting from the time t1, then the output voltage Vout2 from the second inverter INV2, which is produced across the capacitance C2, follows the supply voltage Vdd, with the output voltage Vout2 being less than the supply voltage Vdd by the value of the forward voltage of the diode D2.

The two inverters INV1, INV2 require a minimum supply voltage between their power supply connections A11, A12, A21, A22 and, if the supply voltage falls below this level, are no longer able to convert an input signal to a complementary output signal. The following text is based on the assumption that the supply voltage Vdd falls below this minimum required supply voltage for the two inverters INV1, INV2 after the time t1.

When the supply voltage Vdd reaches this minimum required supply voltage for the inverters INV1, INV2 after the time t2 when it rises again, then the low signal from the output OUT1 of the first inverter INV1 is initially still present at the input IN2 of the second inverter INV2, so that the capacitance C2 is still initially connected to the rising supply potential Vdd via this inverter INV2. The signal Vout2 at the output of the second inverter INV2 can, however, follow the rise in the supply voltage Vdd only more slowly owing to the first capacitance C2, so that a low signal is initially still present at the input IN1 of the first inverter INV1. The first inverter INV1 therefore switches over, and its output signal Vout1 is quickly drawn to the value of the rising supply potential Vdd, so that a high level is present at the input of the second inverter INV2, which connects the output OUT2 of the second inverter INV2 to the reference ground potential GND, in order to discharge the first capacitance C2 and to set the output OUT2 of the second inverter INV2 permanently to a low level.

The output signal Vout1 from the first inverter INV1 thus assumes a complementary switching state in comparison to the switching state after the initialization of the reset cell once the supply voltage Vdd has fallen and risen again. In the case of this reset cell, the output signal Vout1 from the first inverter INV1 can be used directly as the reset signal. In the exemplary embodiment which has been explained, a high level of this first output signal Vout1, that is to say a level which corresponds to the supply potential Vdd, indicates that there is a need to reset a circuit (which is not illustrated in more detail) which is connected to the supply voltage Vdd. This circuit may, for example, be a memory circuit with a large number of static memory cells.

A conventional circuit arrangement can be used (in a manner which is not illustrated in any more detail) for evaluation of this output signal Vout1 which is used as a reset signal, which circuit arrangement detects a rising flank of this output signal Vout1 in order to initiate the resetting or initialization of further circuit components which are connected to the supply voltage Vdd.

In addition to the output signal Vout1, the output signal Vout2 from the second inverter INV2 may, of course, also be used as a reset signal which, in the example, assumes a low level after the supply voltage Vdd has risen again, rather than the high level which existed after the initialization process.

Furthermore, it is also possible to evaluate the output signals Vout1, Vout2 from the two inverters INV1, INV2 using a logic circuit in order to produce a reset signal which then has only one level, which indicates the need to reset a circuit arrangement, when the output signal Vout1 from the first inverter INV1 assumes a high level and the output signal Vout2 from the second inverter INV2 assumes a low level. A logic circuit such as this is illustrated by dashed lines in FIG. 1 and has an AND gate with a non-inverting input and an inverting input, with the output signal Vout1 from the first inverter INV1 being supplied to the non-inverting input, and the output signal Vout2 from the second inverter INV2 being supplied to the inverting input. The reset signal RS is produced at the output of this gate 20 and assumes a high level in order to indicate the need to reset a circuit arrangement when the output signal Vout1 assumes a high level and the output signal Vout2 assumes a low level.

Figure 3:
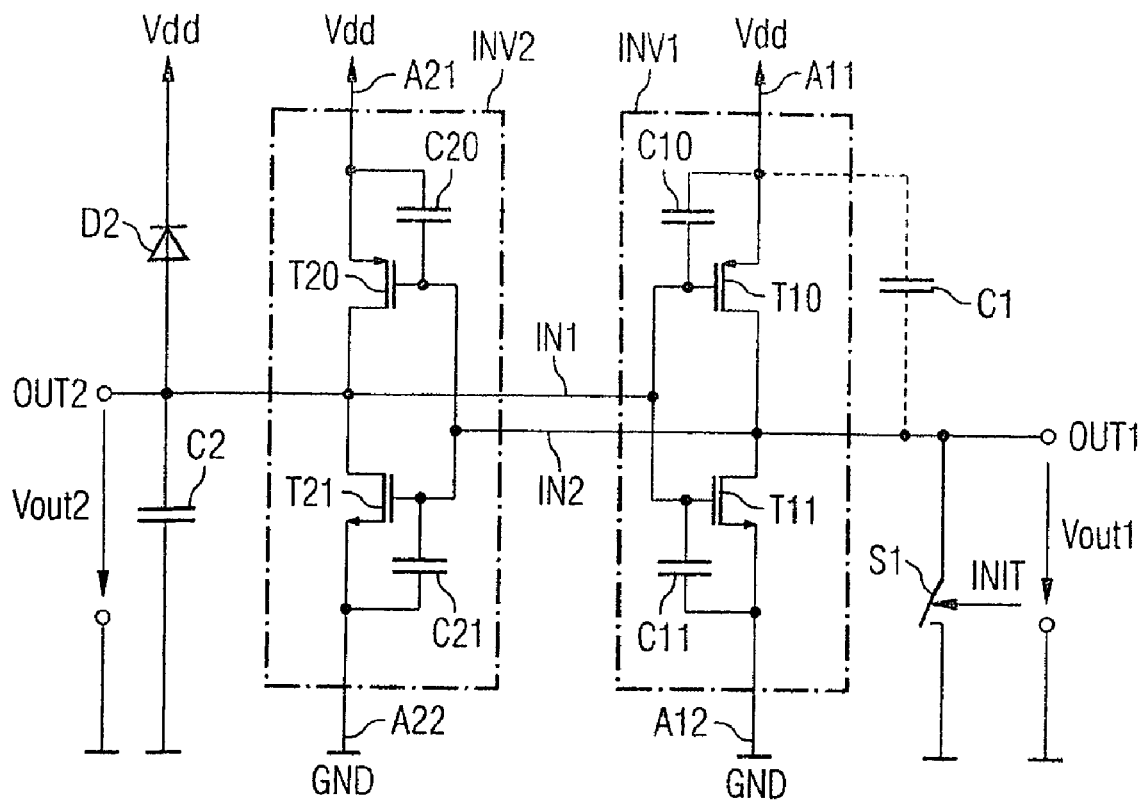
FIG. 3 shows an example of a circuitry implementation of the arrangement shown in FIG. 1 using CMOS inverters.

FIG. 3 shows a circuitry implementation example of the circuit arrangement illustrated in FIG. 1, in which the two inverters INV1, INV2 are each in the form of a CMOS inverter, and which respectively have a first transistor T10, T20 and a second transistor T11, T21. The drain/source paths through the first and second transistors T10, T20, T11, T21 in each inverter INV1, INV2, which form the load paths of the transistors, are connected in series between the supply connections A11, A12, A21, A22 and thus between the terminal for the supply potential Vdd and the terminal for the reference ground potential GND. The first transistors T10, T20 are in the form of p-conductive MOS transistors, whose source connections are connected to the terminal for the supply potential Vdd, while the second transistors T11, T21 are in the form of n-conductive MOS transistors, whose source connections are connected to the reference ground potential GND. The gate connections of the first and second transistors T10, T20, T11, T21 of each inverter INV1, INV2, which form the drive connections for the transistors, are jointly connected to the input IN1, IN2 of the respective inverter INV1, INV2. The nodes which are common to the load paths of the first and second transistors form the outputs OUT1, OUT2 of the inverters INV1, INV2.

In order to assist understanding of the method of operation of the circuit arrangement, FIG. 3 also shows the gate/source capacitances C10, C11, C20, C21 of the transistors T10, T11, T20, T21 in the CMOS inverters. These capacitors C10-C21 are an inherent component of the transistors T10-T21 in the CMOS inverters.

While the method of operation of the circuit arrangement has been described initially with reference to FIG. 1 and taking into account only the basic method of operation of the inverters INV1, INV2, the switching processes in the inverters INV1, INV2 will also be considered for the analysis of the method of operation of the exemplary embodiment shown in FIG. 3.

During the initialization phase, when the input IN2 of the second inverter INV2 is connected to the reference ground potential GND via the switch S1, the first transistor T20 in the second inverter INV2 is switched on, and its second transistor T21 is switched off. The first capacitance C2 is thus charged via the first transistor T20 approximately to the supply potential Vdd, ignoring the voltage drop across the first transistor T20. When the voltage Vout2 across this capacitance C2 reaches the transfer voltage of the first inverter INV1 during this process, the inverter INV1 switches over, that is to say its second transistor T11 is switched on, and its first transistor T10 is switched off. The output OUT1, which is in consequence drawn to a low level, is also kept at a low level after completion of the initialization phase, with this low level corresponding approximately to the reference ground potential GND, ignoring the voltage drop across the switched-on second transistor T11 in the first inverter INV1.

The method of operation of this circuit arrangement will be explained in the following text with reference to FIG. 5, analyzing, in a corresponding manner to FIG. 2, a profile of the supply voltage Vdd in which the supply voltage starts from a nominal value Vn and falls to a level which is considerably lower than the nominal value Vn, before rising again to the nominal value Vn. The output voltage Vout2, which corresponds to the voltage across the first capacitance C2, after the initialization process is slightly below the supply voltage Vdd, with the difference corresponding to the voltage drop across the switched-on first transistor T20 in the second inverter INV2 during the initialization process. This voltage Vout2 which is produced across the capacitance C2 follows the falling supply voltage Vdd, with the voltage across the capacitance Vout2 always being greater than the supply voltage Vdd by a voltage difference ΔV1. This voltage difference ΔV1 corresponds to the forward voltage of the diode D2, which is used as the rectifier element. The output voltage Vout1 from the first inverter INV1 is slightly above the reference ground potential GND after completion of the initialization phase, with the voltage difference resulting from the voltage drop across the second transistor T11 in the first inverter INV1 during the initialization phase.

Figure 4:
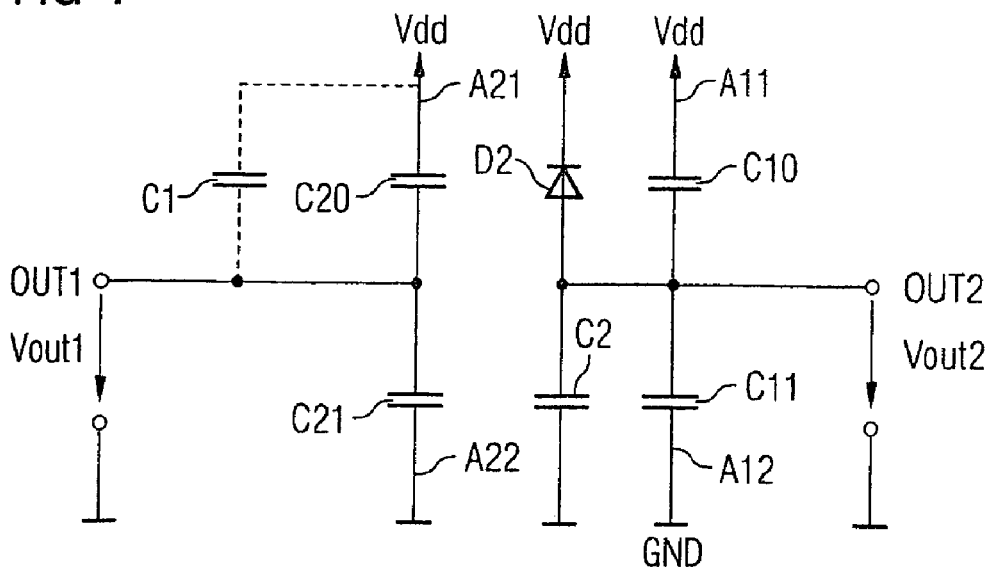
FIG. 4 shows the electrical equivalent circuit of the circuit shown in FIG. 3 for low supply voltages.

In order to assist understanding of the rest of the profile of the output voltage Vout1, FIG. 4 shows the equivalent circuit of the circuit arrangement illustrated in FIG. 3, for values of the supply voltage Vdd which are below the threshold voltage of the transistors T10, T11, T20, T21 in the CMOS inverters INV1, INV2. Normal values for these threshold voltages are between 0.6 V and 0.8 V. The transistors T10, T11, T20, T21 no longer operate at supply voltages Vdd below this minimum value, and only the gate/source capacitances in the circuit shown in FIG. 3 are still effective. The gate/source capacitances C20, C21 of the first and second transistors T20, T21 in the second inverter INV2 in this case form a capacitive voltage divider between the supply potential connection A21 and the reference ground potential connection A22. The gate/source capacitances C10, C11 of the first and second transistors T10, T11 in the first inverter INV1 form a further capacitive voltage divider between the supply potential connection A11 and the reference ground potential connection A12, with the center tap of this capacitive voltage divider being connected via the diode D2 to the supply potential connection Vdd, and with the first capacitance C1 being connected in parallel with the gate/source capacitance C11 of the transistor T11.

When the output voltage Vdd falls in the illustrated circuit arrangement, the second capacitance C2 is thus discharged via the diode D2 and the transistor T20, which is initially still switched on. During this process, when the supply potential Vdd reaches values which are in the region of the threshold voltage of this transistor T20, the transistor T20 is thus switched off, and further discharging of the capacitor C2 takes place exclusively via the diode D2. Once the first transistor T20 in the second inverter INV2 has been switched off, its gate/source capacitance C20 still remains charged to a voltage which corresponds to the threshold voltage of this transistor T20. This charge in the gate/source capacitance C20 of this transistor T20 and the gate/source capacitance C21 (which is connected in series with this gate/source capacitance C20) of the second transistor T21 in the inverter INV2 ensure that the output voltage Vout1 is always lower than the supply voltage Vdd by the value of the threshold voltage as the supply voltage Vdd falls further, so that the output voltage Vout1 can also assume negative values with respect to the reference ground potential GND. ΔV2 in FIG. 5 denotes the voltage across the gate/source capacitance C20 of the first transistor T20 after this transistor has switched off.

When the supply voltage Vdd rises again over the further course of time, it once again reaches values above the threshold voltage of the transistors which, by way of example is about 0.8 V, so that the first transistor T20 in the second inverter INV2, whose gate connection is still at the reference ground potential, starts to conduct again, in order in consequence once again to charge the gate/source capacitance of the second transistor T11 in the first inverter INV1, and the first capacitance C2 which is connected in parallel with it. However, if the supply voltage Vdd rises more quickly than the charging of the parallel circuit comprising the gate/source capacitance C11 of the transistor T11 and the first capacitance C2, and the voltage difference between the supply voltage Vdd and the voltage Vout2 across the parallel circuit formed by the capacitances C11, C2 reaches the value of the threshold voltage of the first transistor T10 in the first inverter INV1, then this transistor T10 is switched on, and draws the output OUT1 of the first inverter INV1 in the direction of the supply potential Vdd, thus regulating the first transistor T20 in the second inverter INV2 down in order to prevent further charging of the parallel circuit formed by the two capacitances C11, C2. At the same time, the second transistor T21 in the second inverter INV2 is driven in the upward direction, in order to discharge the gate/source capacitance C11 of the second transistor T11 in the first inverter INV1 and the first capacitance C2. This second transistor T11 finally switches off, so that the output voltage Vout1 from the first inverter INV1 permanently assumes a high level, with the output voltage Vout2 from the second inverter INV2 also permanently assuming a low level whilst the first capacitance C2 and the gate/source capacitance C11 of the transistor T11 have been discharged completely.

A second capacitance C1 is preferably connected in parallel with the load path of the first transistor T10 in the first inverter INV1, and thus in parallel with the gate/source capacitance C20 of the first transistor T20 in the second inverter INV2, reduces the rate of rise of the gate/source voltage of the first transistor T20 in the second inverter INV2, and thus ensures that this transistor starts to conduct only slowly as the supply voltage Vdd rises, so that the capacitance C2 is charged more slowly after the supply voltage Vdd rises again, in order to ensure that the first inverter INV1 switches over reliably.

In order to produce the circuit arrangement shown in FIG. 3, the transistors T10-T21 in the CMOS inverters INV1, INV2 may be designed to be identical, that is to say to have the same transistor surface areas (equal to W×L) and to each have the same width-to-length ratios (W/L ratios). In this embodiment, additional capacitances in the form of capacitors may be provided in order to produce the first capacitance C1 and, if required, the further capacitance C1, with these capacitors being connected as shown in FIG. 3.

Figure 6A:
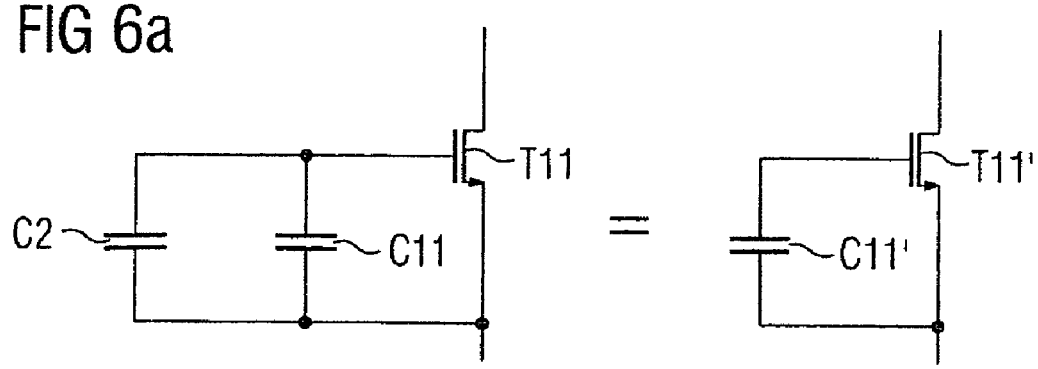
FIG. 6 shows one possible way to provide the capacitances which are illustrated in FIG. 3 and result in the asymmetric capacitive circuitry.

As explained, the first capacitance C2 is connected in parallel with the gate/source capacitance C11 of the second transistor T11 in the first inverter INV1, and the second capacitance C1 is connected in parallel with the gate/source capacitance C20 of the first transistor T20 in the second inverter INV2. With reference to FIG. 6, it is therefore also necessary to choose the first capacitance C2 such that it is an inherent component of the gate/source capacitance of the second transistor T11 in the first inverter INV1. The circuit arrangement shown in FIG. 3 can thus also be produced by using as the second transistor T11 in the first inverter INV1 a transistor T11' whose gate/source capacitance C11' is greater than the gate/source capacitances C10, C20, C21 of the other transistors T10, T20, T21. This can be achieved by the transistor T11' having a larger transistor surface area than the other transistors, in which case the W/L ratio of this transistor may correspond to the W/L ratio of the other transistors.

Figure 6B:
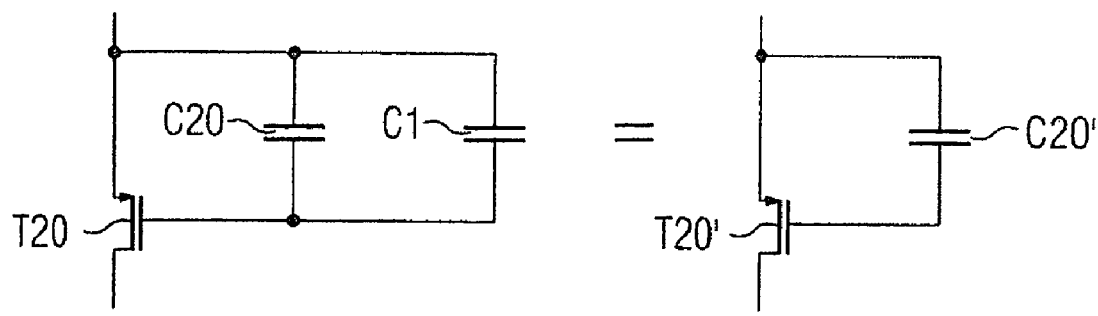

In a corresponding manner, the further capacitance C1, with reference to FIG. 6B, may be an inherent component of a transistor T20' which is used as the first transistor in the second inverter INV2 and whose transistor surface area is larger than that of the transistors T10, T21. The transistor surface area of this transistor T20 corresponds, for example, to the transistor surface area of the transistor T11'.

The significant factor for the operation of the circuit arrangement illustrated in FIG. 3 is that the outputs OUT1, OUT2 of the inverters are connected capacitively asymmetrically.

Figure 7:
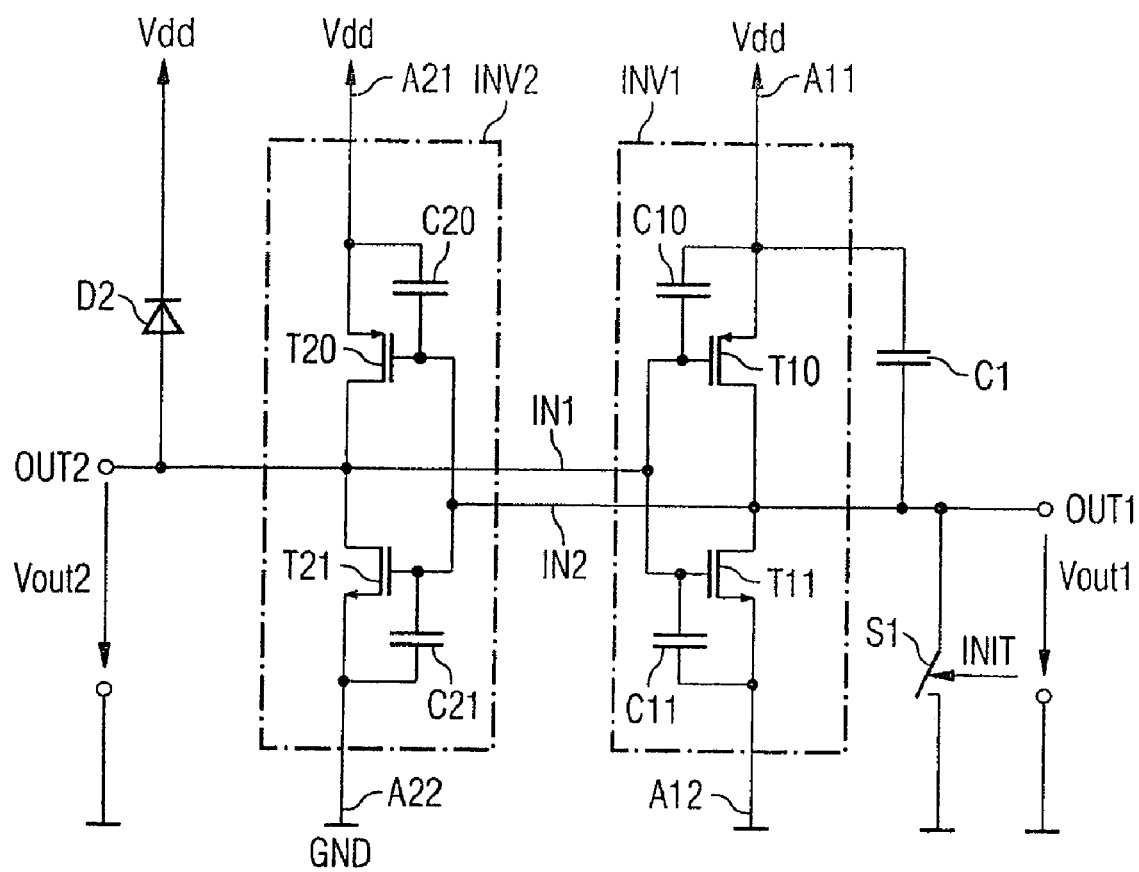
FIG. 7 shows an alternative circuit arrangement to the circuit shown in FIG. 3.

This asymmetry may also be achieved, with reference to FIG. 7, by providing a larger capacitance between the output OUT1 of the first inverter INV1 and the supply potential terminal A11 than that between the output OUT2 of the second inverter INV2 and the supply potential terminal A12. In the exemplary embodiment shown in FIG. 7, only the capacitance C1 between the output OUT1 and the supply potential terminal Vdd is provided for this purpose, which ensures, as the supply voltage Vdd rises again, that the first transistor T20 in the second inverter INV2 starts to conduct only slowly. This capacitance C1 may, with reference to FIG. 6B, be an inherent component of a transistor T21' which is used as the first transistor in the second inverter INV2, while the other transistors T10, T11, T21 are preferably each designed to be identical.

Figure 5:
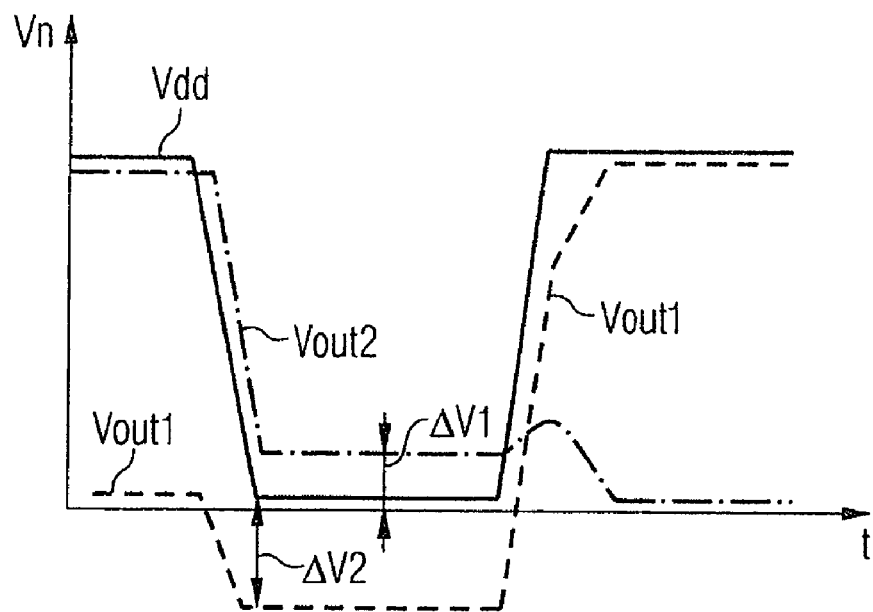
FIG. 5 shows, by way of example, time profiles of signals in the circuit illustrated in FIG. 1, in order to explain the method of operation when the supply voltage falls.

The reset cells explained so far, with the two cross-coupled inverters whose outputs are connected capacitively asymmetrically, reliable produce a reset signal whenever the fluctuations in the supply voltage Vdd take place comparatively quickly, as is illustrated in FIGS. 2 and 5. The principle of operation is based on the idea of connecting a larger capacitance between the output of one inverter and one of the supply voltage terminals than that between the output of the other inverter and this supply voltage terminal.

The reset cells explained so far with cross-coupled inverters INV1, INV2 which have asymmetric output capacitances may reach their limits, however, when very slow changes occur in the supply voltage Vdd, in particular when the supply voltage Vdd has fallen to a low voltage level for a long time and then rises only very slowly.

Figure 8A:
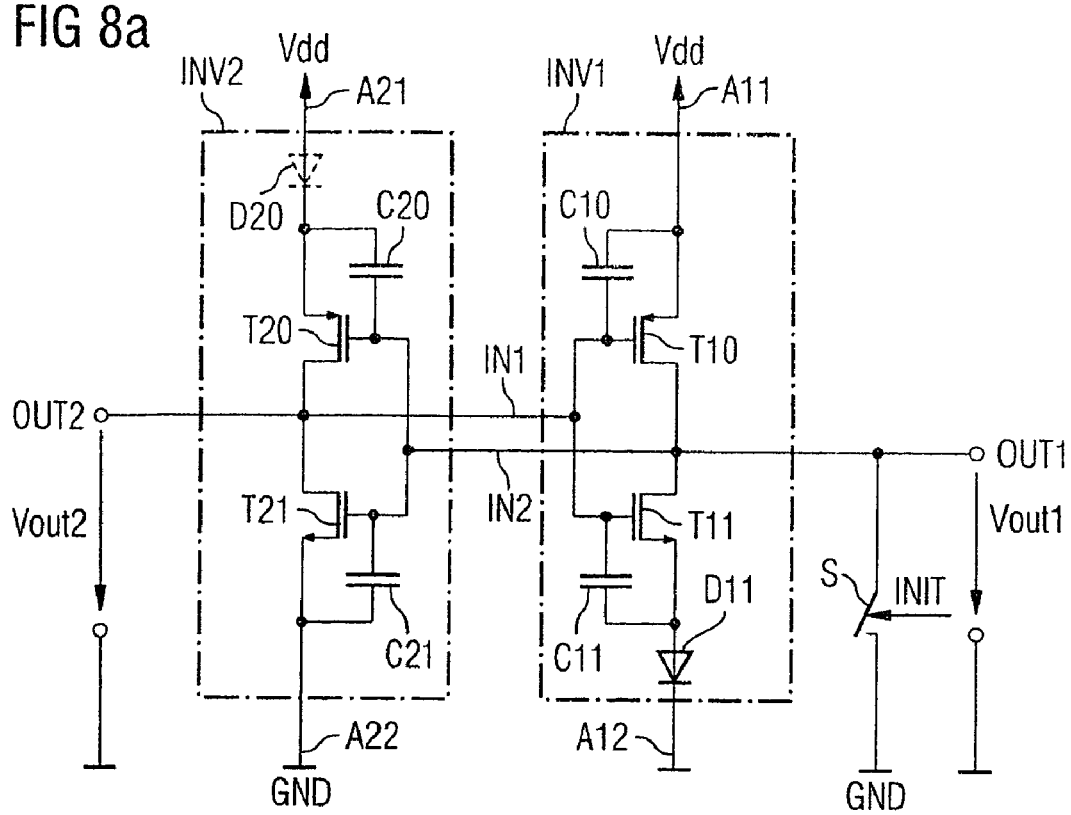
FIG. 8 shows a further exemplary embodiment of a circuit arrangement according to the invention having two cross-coupled inverters which have different transfer points.

FIG. 8 shows an exemplary embodiment of a reset cell which is suitable for detection of even profiles of the supply voltage Vdd such as these, in order to produce a suitable reset signal.

This reset cell has a first and a second inverter INV1, INV2, which are cross-coupled by connecting the output OUT2 of the second inverter INV2 to the input IN1 of the first inverter INV1, and by connecting the output OUT1 of the first inverter INV1 to the input IN2 of the second inverter INV2. This reset cell can be initialized by means of a switch S, on the basis of an initialization signal INIT. This switch S is connected between the input IN2 of the second inverter INV2, and a reference ground potential GND. This switch S is closed for initialization, thus resulting in an output signal Vout1 from the first inverter INV1 assuming a low level, and the output signal Vout2 from the second inverter INV2 assuming a high level. These level states are also maintained after completion of the initialization process, owing to the cross-coupling of the two inverters INV1, INV2.

The two inverters INV1, INV2 are in the form of CMOS inverters, and each have a first transistor T10, T20 and a second transistor T11, T21, which are each connected between first and second connecting terminals A11, A12, A21, A22 and are driven jointly. The capacitors C10-C21, which are in each case shown between the gate connections and the source connections of these transistors T20-T21 that are in the form of MOSFETs, respectively represent the gate/source capacitances of these transistors.

The two inverters INV1, INV2 in this reset cell are designed to have different transfer voltages. The transfer voltage of an inverter in this case refers to the value of a voltage which is applied to its input which results in the output voltage reaching 50% of its level range, that is to say the input voltage at which the inverter switches over. In the example shown in FIG. 8, the inverter INV1 has a higher transfer voltage than the second inverter INV2.

Figure 8B:
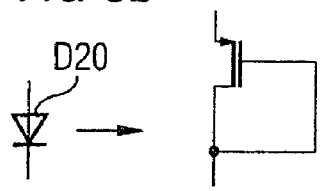

The transfer voltage of the first inverter INV1, which is higher than that of the second inverter INV2 is achieved by connecting a diode D11 in series with the second transistor T11 between the output terminal OUT1 and the reference ground potential terminal A12. In particular, this diode D11 may be in the form of a MOSFET which is connected as a diode, as is illustrated in FIG. 8b. The transfer voltage of the first inverter INV1 is greater than the transfer voltage of the second inverter INV2, since the threshold voltage of the second transistor T11 plus the forward voltage of the diode D11 must be present at the input IN1 of this inverter before the second transistor T11 starts to conduct.

The method of operation of the reset cell illustrated in FIG. 8 will be explained in the following text with reference to the time profile of the supply voltage Vdd in FIG. 9. This is based on the assumption that the supply voltage Vdd has fallen to a value which is below the threshold voltage of the transistors in the reset cell, and that the supply voltage Vdd has already been at this potential for a long time, so that the potentials at the inputs IN1, IN2 and the outputs OUT1, OUT2 of the inverters INV1, INV2 have fallen to this low supply voltage value.

Figure 9:
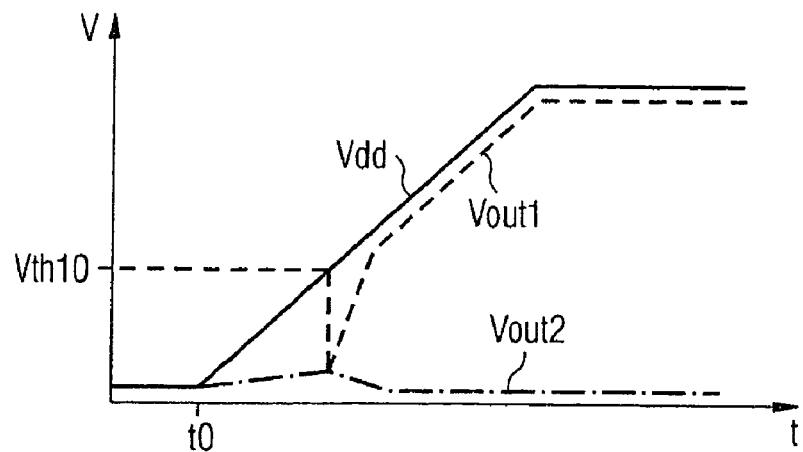
FIG. 9 shows examples of the time profiles of signals in the circuit illustrated in FIG. 8, in order to explain the method of operation when the supply voltage falls and rises slowly again.

With reference to FIG. 9, the supply voltage Vdd starts to rise slowly at a time t0. As soon as the supply voltage Vdd has risen to a value Vth10 at which the voltage between the source connection of the first transistor T10 in the inverter INV1 and the input IN1 of the first inverter INV1 corresponds to the threshold voltage of this first transistor T10, this transistor T10 starts to conduct, and the output voltage Vout1 from the first inverter INV1 starts to follow the supply voltage Vdd, with the output voltage Vout1 from the first inverter INV1 always remaining below the supply voltage Vdd by the value of the threshold voltage of the first transistor T10.

The first transistor T20 in the second inverter INV2 is switched on in a corresponding manner to the first transistor T10 in the first inverter INV1. In this case, the voltage at the two outputs OUT1, OUT2 rises, and the voltage at the inputs of the respective other inverter INV2, INV1 thus in each case initially rises in the same way. The diode D11 which is connected in series with the second transistor T11 in the first inverter INV1 results in this second transistor T11 not starting to conduct until the voltages at its input IN1 are higher than those of the second transistor T21 in the second inverter INV2. The switched-on second transistor T21 in the second inverter INV2 prevents the potential at the input IN1 of the first inverter INV1 from rising, so that the second transistor T11 in the first inverter INV1 remains switched off, and the output voltage Vout1 from this first inverter INV1 follows the supply voltage Vdd in the manner explained above.

At the end of the rise of the supply voltage Vdd, there is therefore a voltage level at the output OUT1 of the first inverter INV1 which corresponds to the supply voltage Vdd, and which is thus complementary to the voltage level after the initialization process, which corresponded to the reference ground potential GND. The output signal Vout1 from the first inverter INV1 in this reset cell can thus be used directly as a reset signal. This output signal Vout1 assumes a low level after the initialization process and during normal operation, when no fluctuations occur in the supply voltage Vdd, and rises to a high level after a long-term drop in the supply voltage Vdd and a slow rise in the supply voltage Vdd.

One significant factor for the operation of the reset cell illustrated in FIG. 8 is for the two inverters INV1, INV2 to have different transfer voltages, particularly for the first inverter INV1 to have a higher transfer voltage than the second inverter. As explained, this can be achieved by one of the two inverters, the second inverter INV2 in the situation being explained, being a symmetrical CMOS inverter, while the transfer voltage of the other of the two inverters, in the illustrated case the first inverter INV1, is increased in comparison to the transfer voltage of a symmetrical CMOS inverter by the insertion of an additional diode D11.

Figure 8C:
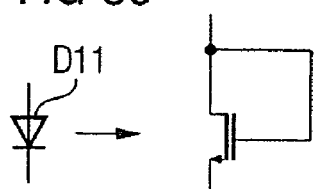

The reliability of the reset cell illustrated in FIG. 8 for identification of a drop in the supply voltage Vdd can be improved by reducing the transfer voltage of the second inverter INV2 in comparison to the transfer voltage of a symmetrical CMOS inverter. This can be achieved by connecting a further diode D20 in series with the first transistor C20 between the positive supply potential Vdd and the output OUT2, which, with reference to FIG. 8c, may, for example, be in the form of a p-conductor MOSFET with a low threshold voltage (low threshold MOSFET), which is connected as a diode. The threshold voltage of this transistor that is in the form of a diode is in this case lower than the threshold voltage of the CMOS transistors which are required to produce the inverters. Normal values for the threshold voltage of low threshold transistors such as these are in the region of about 0.4 V. The additional diode D20 results in the first transistor T20 in the second inverter INV2 not starting to conduct until the supply voltages are higher than those on the first transistor T10 in the first inverter INV1, so that the potential at the input IN1 of the first inverter INV1 is always lower than the potential at the input IN2 of the second inverter INV2, thus increasing the effect explained above, on the basis of which the second transistor T21 in the second inverter INV2 starts to conduct before the second transistor T11 in the first inverter INV1 when the supply voltage rises.

Figure 10A:
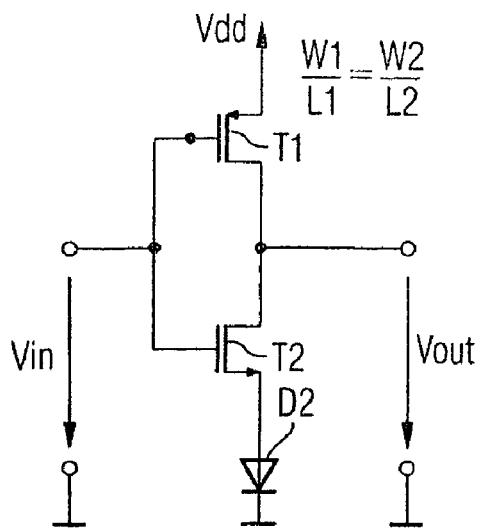
FIG. 10 shows various concepts for variation of the transfer point of a CMOS inverter.

As already explained, the transfer voltage of a CMOS inverter can be varied in comparison to the transfer voltage of a symmetrical CMOS inverter by the insertion of additional diodes. FIG. 10a once again shows a CMOS inverter such as this having a first and a second transistor T1, T2, which are driven jointly via an input voltage Vin, and which produces an output voltage Vout. The two transistors T1, T2 are symmetrical, that is to say they have the same width-to-length ratios (W1/L1=W2/L2). The transfer voltage of this inverter as shown in FIG. 10a is increased above the transfer voltage of a symmetrical CMOS inverter by the insertion of an additional diode D2 in series with the second transistor T2.

Figure 10B:
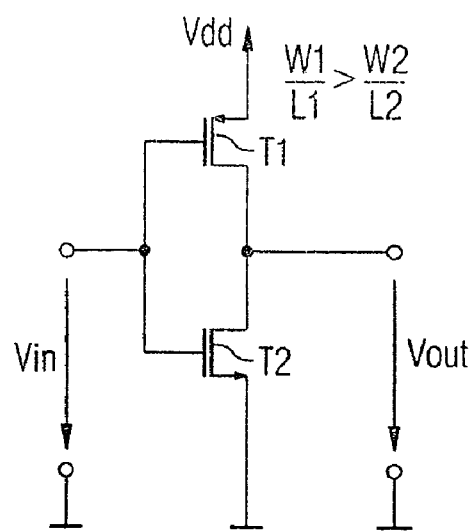
Figure 10C:
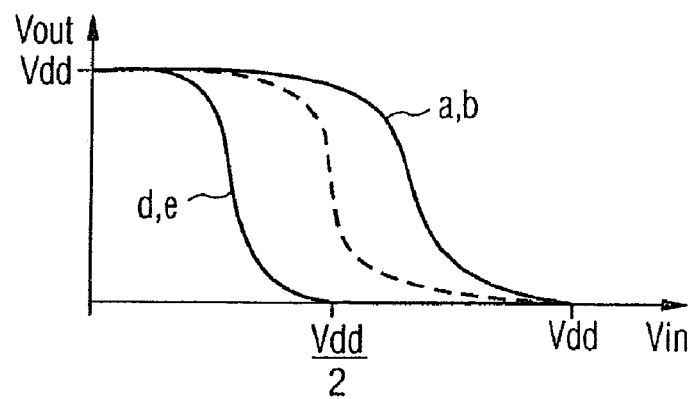

The dashed lines in FIG. 10c show the transfer characteristic of a symmetrical CMOS inverter. The transfer characteristic of the inverter shown in FIG. 10a is shifted towards higher input voltage values Vin in comparison to this transfer characteristic.

With reference to FIG. 10b, it is also possible to produce an inverter with a higher transfer voltage by varying the width-to-length ratio of the two CMOS inverters. A higher transfer voltage than that of a symmetrical CMOS inverter can be achieved by the width-to-length ratio of the p-conductive transistor T1 being greater than the width-to-length ratio of the n-conductive transistor T2.

Figure 10D:
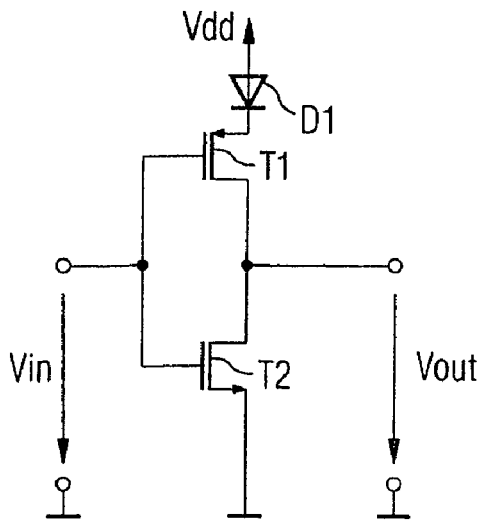

As already explained and as illustrated once again in FIG. 10d, a CMOS inverter whose transfer voltage is lower than that of a symmetrical CMOS inverter can be produced by connecting a diode D1 in series with the p-conductive transistor T1 between the supply potential Vdd and the output OUT. The transfer characteristic of an inverter such as this is likewise illustrated in FIG. 10c. In addition to the provision of an additional diode D1, a CMOS inverter with a lower transfer voltage can also be achieved, with reference to FIG. 10e, by the width-to-length ratio of the p-conductive transistor T1 being lower than the width-to-length ratio of the n-conductive transistor T2.

The width-to-length ratio of an MOS transistor governs, in a manner which has been known for a long time, the ratio between the input voltage of this transistor and its load current, with the load current rising, for the same input voltage, as the width-to-length ratio increases. This results in the transfer voltage shifts which have been explained when different width-to-length ratios are chosen for the transistors in a CMOS inverter.

Figure 11:
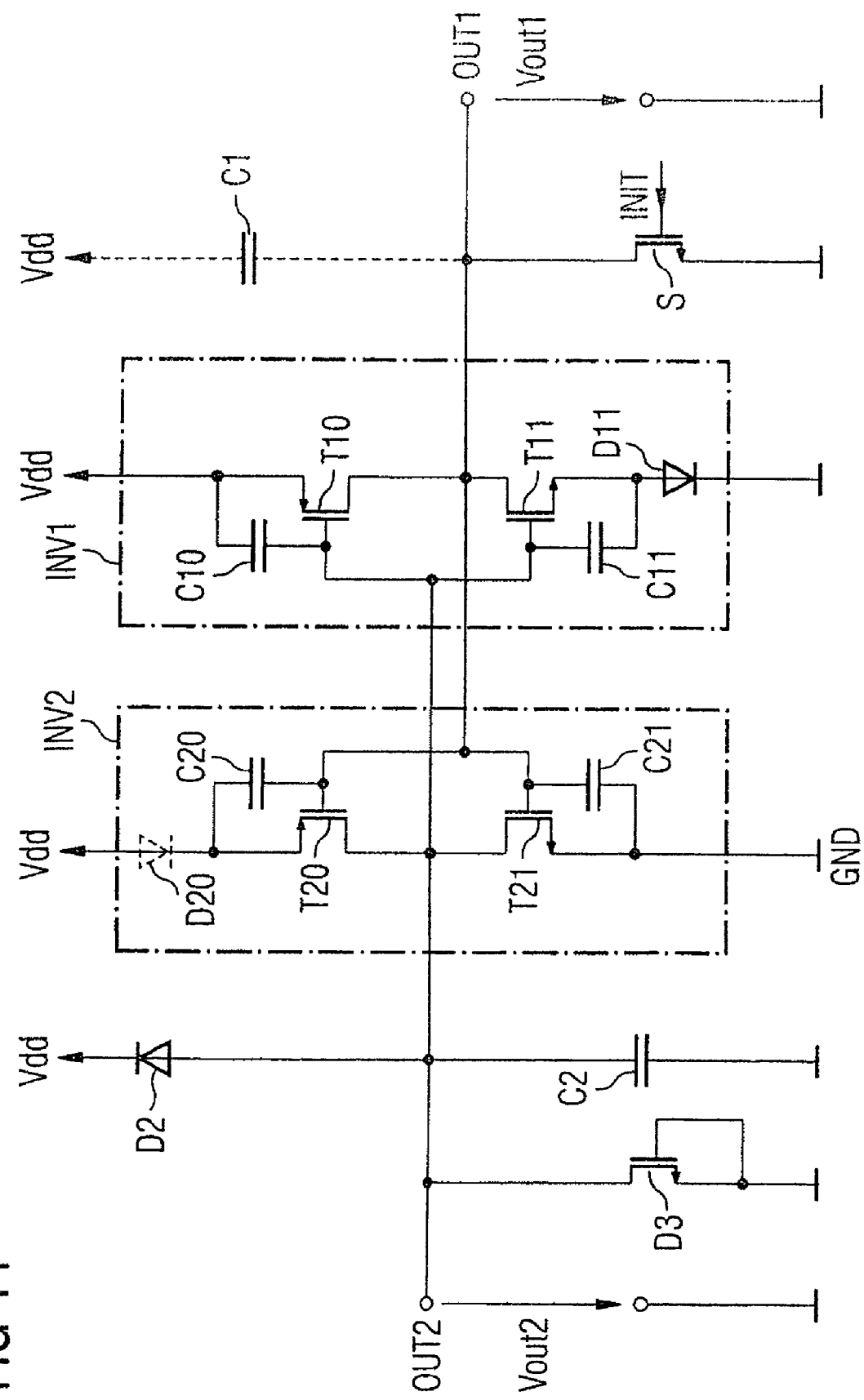
FIG. 11 shows an exemplary embodiment of a circuit arrangement according to the invention which has two cross-coupled inverters which are connected capacitively asymmetrically and which have different transfer points.

The already explained concepts for production of reset cells, specifically on the one hand the use of cross-coupled inverters INV1, INV2 with capacitively asymmetric output capacitances, and on the other hand the use of inverters with different transfer voltages, are advantageously combined with one another, as is illustrated in FIG. 11.

Figure 10E:
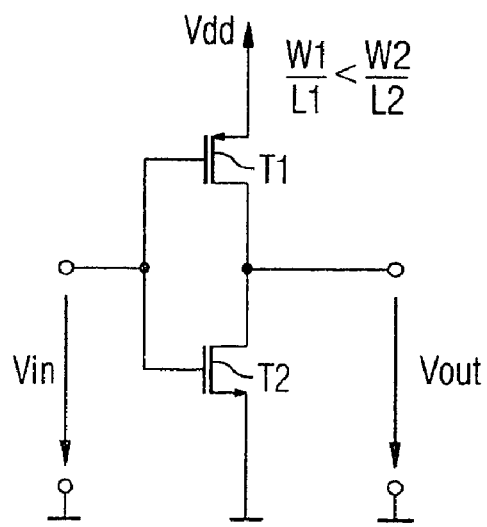

FIG. 11 shows a reset cell with a first and a second inverter INV1, INV2 with a greater capacitance than that between the output OUT1 of the first inverter INV1 and the reference ground potential GND being provided between the output OUT2 of the second inverter INV2 and the reference ground potential GND by the addition of a capacitor C2. Furthermore, the two inverters INV1, INV2 in the exemplary embodiments are chosen such that the first inverter INV1 has a higher transfer voltage than the second inverter INV2. The first inverter INV1 is in this case designed to correspond to the first inverter INV1 in the reset cell shown in FIG. 8, or in a corresponding manner to the inverter in FIG. 10a. This inverter INV1 may, of course, also be replaced by an inverter corresponding to that in FIG. 10b. The second inverter INV2 is a symmetrical CMOS inverter, which may optionally also be formed in a corresponding manner to the inverter shown in FIG. 10d, or in a corresponding manner to the inverter shown in FIG. 10e. Alternatively, it is possible for the second inverter INV2 to be in the form of an inverter as shown in FIG. 10d or 10e, and for the first inverter INV1 to be a symmetrical CMOS inverter.

This reset cell as shown in FIG. 11 is reset in a corresponding manner to the reset cells which have been explained in FIGS. 3 and 8, by connecting the input IN1 of the second inverter INV2 to the reference ground potential by means of a switch S. In FIG. 11, the switch S is in the form of an n-conductive MOSFET, which is driven by the initialization signal INIT. For symmetry reasons, an MOS transistor D3, which is connected as a switched-off transistor, is connected between the input IN1 of the first inverter INV1 and the reference ground potential.

This reset cell shown in FIG. 11 operates in the same way as the reset cell shown in FIG. 3 when rapid fluctuations occur, particularly when the supply voltage Vdd falls rapidly, and operates in a corresponding manner to the reset cell shown in FIG. 8 when slow changes occur in the supply voltage Vdd.

A number of reset cells with different dimensions are advantageously used for detection of a time profile of the supply voltage Vdd at whose end it is necessary to reset circuit components which are connected to this supply voltage Vdd.

Figure 12:
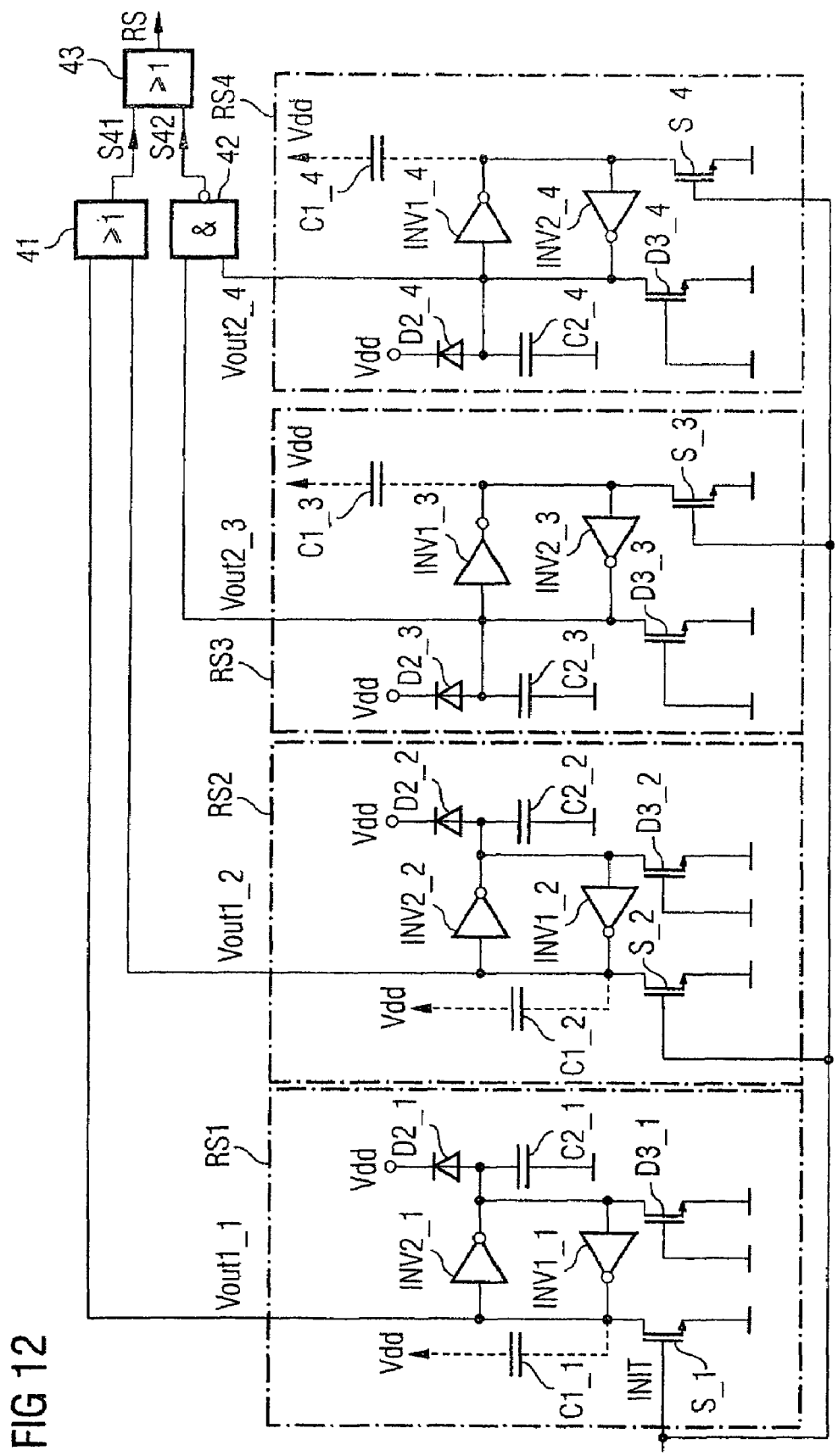
FIG. 12 shows an arrangement having a number of reset cells, with different dimensions, in order to produce a reset signal.

FIG. 12 shows an arrangement with four reset cells RS1, RS2, RS3, RS4 which each have different dimensions.

In principle, the design of each of these reset cells corresponds to the design of the reset cell illustrated in FIG. 1. In order to assist understanding, the individual components of these reset cells RS1-RS4 are provided with the same reference symbols and differ only by the letter "n", with "n" indicating the order of one of the reset cells RS1-RS4, which are numbered successively from 1 to 4.

Each reset cell RSn has a first inverter INV1_n and a second inverter INV2_n, which are cross-coupled. A first capacitance C2_n is connected between the output of the second inverter INV2_n and the reference ground potential, and is also connected to the supply potential Vdd via a diode D2_n. Additional capacitors C1_n can optionally be connected between the outputs of the first inverter INV1_n and the supply potential Vdd in order to increase the capacitive asymmetry of the outputs of the inverters INV1_n, INV2_n. Each reset cell RSn has a switching element S_n via which the reset cell RSn can be initialized on the basis of an initialization signal INIT. The switching element S_n is in each case connected between the output of the second inverter INV2_n and the reference ground potential GND, so that a lower voltage level is in each case produced at the output of the first inverter INV1_n after the initialization process, corresponding essentially to the reference ground potential GND, and a high voltage level is produced at the output of the second inverter INV2_n, corresponding essentially to the supply potential Vdd.

The first and second reset cells RS1, RS2 therefore have different dimensions such that, in the case of the reset cell RS1, the second inverter INV2_1 has a higher transfer voltage than the first inverter INV1_1, while in the case of the second reset cell RS1, the second inverter INV2_2 has a lower transfer voltage than the first inverter INV1_2. Reference should be made to the statements made above, in particular to the statements relating to FIG. 10, for the production of inverters such as these with a different transfer voltage in a reset cell.

The different dimensions of the two reset cells RS1, RS2 take account of the fact that fluctuations in the supply voltage Vdd represent disturbance situations, whose occurrence and time profile cannot be predicted. Depending on the respective dimensions, individual reset cells may be differently well suited for the identification of individual disturbance situations.

In the case of the arrangement shown in FIG. 12, the output voltages Vout1_1, Vout1_2 of the first inverters INV1_1, INV1_2 are processed further in a logic circuit 41, 42, 43. In the example, this logic circuit is an OR gate 41, to which the output signals Vout1_1, Vout1_2 from the two reset cells RS1, RS2 are supplied. The output signal S41 from this OR gate 41 is supplied to a further OR gate 43, at whose output a reset signal RS is produced. In this case, in order to produce a high level for this reset signal S43, it is sufficient for only one of the two output signals Vout1_1, Vout1_2 from the two reset cells RS1, RS2 to assume a high level. After the initialization process, these output signals are initially at a low level and assume a high level only when the supply voltage Vdd has fallen.

The design of the third reset cell RS3 corresponds, by way of example, to the design of the first reset cell RS1, so that the first inverter INV1_3 in this reset cell RS3 likewise has a higher transfer voltage than the second inverter INV2_3 in this reset cell RS3. Furthermore, the design of the fourth reset cell RS4 corresponds to the design of the second reset cell RS2, whose first inverter INV1_4 thus has a lower transfer voltage than its second inverter INV2_4. However, the output signal Vout2_3, Vout2_4 from the second inverters INV2_3, INV2_4, which are at a high level after resetting, are evaluated by these third and fourth reset cells RS3, RS4. These output signals are supplied to an NAND gate 42, whose output signal S42 is supplied to the already explained OR gate 43. A high level is produced at the output of this NAND gate 42 only in order to likewise set the reset signal S43 to a high level when the output signal Vout2_3, Vout2_4 from one of these reset cells RS3, RS4 assumes a low level.

LIST OF REFERENCE SYMBOLS

Vdd Supply voltage, supply potential
GND Reference ground potential
INV1, INV2 Inverter
IN1, IN2 Inputs
OUT1, OUT2 Outputs
VOUT1, VOUT2 output voltages, output signals
D2 Diode
C2 Capacitor
RS Reset signal
S Switch
INIT Initialization signal
T10, T20 p-channel transistors
T11, T21 n-channel transistors
C10, C20 Gate/source capacitances
C11, C21 Gate/source capacitances
C1 Capacitor
D11, D20 Diodes
T1 p-conductive transistor
T2 n-conductive transistor
D1, D2 Diodes
Vin Input voltage
Vout Output voltage
INV1_n, INV2_n Inverters
D2_n Diodes
C2_n Capacitors
C1_n Capacitors
S_1 Switching elements
D3_1 Diodes
Vout1_1, Vout1_2 Output signals
Vout2_3, Vout2_4 Output signals
RS1-RS4 Reset cells
41, 43 OR gates
42 NAND gates

The invention claimed is:

1. A circuit arrangement configured to produce a reset signal after a supply voltage has fallen and risen again comprising:
   a first inverter having a first inverter input, a first inverter output, and a first and a second supply voltage connection, the first inverter also having a first transfer voltage;
   a second inverter having a second inverter input, a second inverter output, and a first and a second supply voltage connection, wherein the first inverter output is operably coupled to the second inverter input and the second inverter output is operably coupled to the first inverter input, the second inverter having a second transfer voltage, the first and the second transfer voltages having different values;
   an initialization circuit operably connected to the first inverter input or the second inverter input; a first rectifier element operably connected between the second inverter output and the first supply voltage connection of the first or second inverter;
   a first capacitance provided between the second inverter output and the second supply voltage connection of the first or second inverter; and
   a second capacitance provided between the first inverter output and the second supply voltage connection of the first or second inverter, wherein the first capacitance is larger than the second capacitance.

2. The circuit arrangement of claim 1, wherein the first and second inverters each include a first and a second transistor, the second transistor being complementary to the first transistor;
   wherein each of the first and second transistors of the first and second inverters comprises a load path and a drive connection;
   wherein each load path is connected between the first and second supply voltage connection of the first or second inverter; and
   wherein each drive connection is connected to the first inverter input or the second inverter input.

3. The circuit arrangement of claim 2, wherein the first capacitance comprises a capacitor operably connected to the second inverter output.

4. The circuit arrangement of claim 2, wherein the first capacitance is formed by a drive capacitance of one of the transistors in the first inverter.

5. The circuit arrangement of claim 2, wherein the first and second transistors in at least one of the inverters have different width-to-length ratios.

6. The circuit arrangement of claim 2, wherein at least one further rectifier element is operably connected in series with the load paths of the first and second transistors in at least one of the inverters.

7. The circuit arrangement of claim 1, wherein the initialization circuit comprises a switch operably connected between the second inverter input and the second supply voltage connection of the first or second inverter, the switch being controlled by an initialization signal.

8. The circuit arrangement of claim 7, wherein the switch comprises a transistor, and wherein a further transistor is operably connected as a diode between the first inverter input and the second supply voltage connection of the first or second inverter.

9. A circuit arrangement for production of a reset signal after a supply voltage has fallen and risen again, the circuit arrangement comprising:
   a first inverter having a first inverter input, a first inverter output, a first transfer voltage, and first and second supply voltage connections;
   a second inverter having a second inverter input, a second inverter output, a second transfer voltage, and first and second supply voltage connections;
   wherein the first inverter output is operably coupled to the second inverter input and the second inverter output is operably coupled to the first inverter input, and wherein the first and second transfer voltages have different values; and
   a first capacitance provided between the second inverter output and the second supply voltage connection of the first or second inverter;
   a second capacitance provided between the first inverter output and the second supply voltage connection of the first or second inverter, the first capacitance being larger than the second capacitance;
   the first and second inverters each include a first and a second transistor, the second transistor being complementary to the first transistor, and each transistor comprising a load path and a drive connection, the load paths of the first and second transistors of each inverter are connected in series between the first and second supply voltage connections of each inverter; and the drive connections of the first and second transistors of each inverter are jointly connected to the input of the respective inverter; and the first and second transistors in at least one of the inverters have different width-to-length ratios to provide different transfer voltages for the first and the second inverters.

10. The circuit arrangement of claim 9, wherein at least one rectifier element is connected in series with the load paths of the first and second transistors in at least one inverter.

11. The circuit arrangement of claim 10, wherein the at least one rectifier element comprises a transistor having a low threshold voltage, the transistor being connected as a diode.

12. The circuit arrangement of claim 11, wherein the threshold voltage of the transistor is approximately 0.4 V.

13. A method of producing a reset signal after a supply voltage has fallen and risen again, the method comprising:
    providing the supply voltage between a first supply voltage terminal and a second supply voltage terminal;
    providing a first circuit operably connected to the supply voltage;
    providing a reset circuit comprising: a first inverter including an first inverter input and a first inverter output, the first inverter connected between the first supply voltage terminal and the second supply voltage terminal, wherein the first inverter has a first transfer voltage; and
    a second inverter including a second inverter input and a second inverter output, the second inverter connected between the first supply voltage terminal and the second supply voltage terminal, wherein the second inverter has a second transfer voltage;
    wherein the first inverter output is operably coupled to the second inverter input and the second inverter output is operably coupled to the first inverter input, and wherein the first and second transfer voltages have different values;
    providing a first capacitance between the second inverter output and the second supply voltage terminal;
    providing a second capacitance between the first inverter output and the second supply voltage terminal, wherein the first capacitance is larger than the second capacitance;
    operably connecting the reset circuit to the first circuit; and using the reset circuit to generate a reset signal for the first circuit when the supply voltage has fallen and risen again.

14. The method of claim 13, further comprising:
    providing each inverter with a first and second transistor, the second transistor being complementary to the first transistor;
    wherein each transistor comprises a load path and a drive connection;
    wherein the load paths of the first and second transistors of each inverter are connected in series between the first and second supply voltage terminals; and
    wherein the drive connections of the first and second transistor of each inverter are jointly connected to the input of the respective inverter.

15. The method of claim 13, further comprising: providing the first and second transistors in at least one of the inverters with different width-to-length ratios to provide different transfer voltages for the inverters.

16. The method of claim 13, further comprising: operably connecting at least one rectifier element in series with the load paths of the first and second transistors in at least one inverter.

* * * * *